United States Patent
Muto et al.

(10) Patent No.: US 9,509,926 B2
(45) Date of Patent: Nov. 29, 2016

(54) PHOTOELECTRIC CONVERSION DEVICE, IMAGE PICKUP SYSTEM, AND DRIVING METHOD OF PHOTOELECTRIC CONVERSION DEVICE HAVING A SWITCH INCLUDING A SHORT-CIRCUIT, IN ON STATE, BETWEEN INPUT AND OUTPUT NODES OF A GAIN APPLICATION UNIT

(71) Applicant: CANON KABUSHIKI KAISHA, Tokyo (JP)

(72) Inventors: Takashi Muto, Kawasaki (JP); Takeru Suzuki, Kawasaki (JP); Yasushi Matsuno, Fujisawa (JP); Daisuke Yoshida, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 77 days.

(21) Appl. No.: 14/141,309

(22) Filed: Dec. 26, 2013

(65) Prior Publication Data

US 2014/0184865 A1    Jul. 3, 2014

(30) Foreign Application Priority Data

Dec. 28, 2012  (JP) .................................. 2012-287250

(51) Int. Cl.
*H04N 5/355* (2011.01)
*H04N 5/378* (2011.01)
(Continued)

(52) U.S. Cl.
CPC ............. *H04N 5/355* (2013.01); *H03M 1/183* (2013.01); *H04N 5/3575* (2013.01); *H04N 5/378* (2013.01); *H04N 5/37457* (2013.01); *H03M 1/56* (2013.01); *H04N 5/376* (2013.01); *H04N 5/3741* (2013.01)

(58) Field of Classification Search
CPC .. H04N 5/335; H04N 5/378; H04N 5/37457; H04N 5/3575
See application file for complete search history.

(56) References Cited

U.S. PATENT DOCUMENTS

| 5,422,643 A | 6/1995 | Chu |
| 6,195,031 B1 | 2/2001 | Feld et al. |

(Continued)

FOREIGN PATENT DOCUMENTS

| CN | 1645918 A | 7/2005 |
| EP | 1538827 A1 | 6/2005 |

(Continued)

OTHER PUBLICATIONS

Office Action the State Intellectual Property Office of the People's Republic of China; Aug. 30, 2016, pp. 1-19.

*Primary Examiner* — Abdelaaziz Tissire
(74) *Attorney, Agent, or Firm* — Canon USA, Inc. IP Division

(57) ABSTRACT

A photoelectric conversion device includes analog signal output units including pixels and configured to output analog signals based on pixels, and signal processing units. Each of the signal processing units is provided correspondingly to one of the analog signal output units and including a gain application unit configured to apply a gain to an analog signal by using only passive elements and an AD conversion unit. In the gain application unit, a portion that contributes to application of a gain to the analog signal is constituted only of passive elements. The gain application unit selectively outputs a first amplified signal obtained by applying a first gain to the analog signal or a second amplified signal obtained by applying a second gain to the analog signal smaller than the first gain. The AD conversion unit converts, from analog to digital, the first or second amplified signal.

7 Claims, 16 Drawing Sheets

(51) Int. Cl.
   *H04N 5/357*   (2011.01)
   *H04N 5/3745*  (2011.01)
   *H03M 1/18*    (2006.01)
   *H04N 5/376*       (2011.01)
   *H04N 5/374*       (2011.01)
   *H03M 1/56*        (2006.01)

(56) References Cited

U.S. PATENT DOCUMENTS

| | | | |
|---|---|---|---|
| 6,720,903 B2 | 4/2004 | Confalonieri | |
| 2005/0151680 A1* | 7/2005 | Kearney | 341/172 |
| 2005/0168602 A1* | 8/2005 | Sumi et al. | 348/294 |
| 2008/0094494 A1* | 4/2008 | Lee et al. | 348/294 |
| 2009/0237535 A1* | 9/2009 | Okumura | 348/294 |
| 2009/0267817 A1* | 10/2009 | Schatzberger | 341/138 |
| 2010/0271248 A1* | 10/2010 | Yamaoka et al. | 341/155 |
| 2010/0315278 A1* | 12/2010 | Hurrell | 341/156 |
| 2011/0025420 A1* | 2/2011 | Sumi et al. | 330/278 |
| 2012/0104235 A1* | 5/2012 | Sumi et al. | 250/208.1 |
| 2012/0138775 A1* | 6/2012 | Cheon et al. | 250/208.1 |
| 2012/0242878 A1* | 9/2012 | Yoshida | 348/300 |
| 2013/0026343 A1* | 1/2013 | Saito et al. | 250/208.1 |
| 2013/0033630 A1 | 2/2013 | Hashimoto et al. | |
| 2013/0206961 A1* | 8/2013 | Ikeda et al. | 250/208.1 |
| 2013/0229543 A1* | 9/2013 | Hashimoto et al. | 348/222.1 |
| 2014/0034812 A1* | 1/2014 | Keusgen et al. | 250/208.1 |
| 2014/0184844 A1* | 7/2014 | Muto et al. | 348/222.1 |

FOREIGN PATENT DOCUMENTS

| | | |
|---|---|---|
| EP | 1569346 A2 | 8/2005 |
| JP | H11-261764 A | 9/1999 |
| JP | 2005-175517 A | 6/2005 |
| JP | 2007-181088 A | 7/2007 |
| JP | 2010-016416 A | 1/2010 |
| JP | 2010-147614 A | 7/2010 |

* cited by examiner

PHOTOELECTRIC CONVERSION DEVICE, IMAGE PICKUP SYSTEM, AND DRIVING METHOD OF PHOTOELECTRIC CONVERSION DEVICE HAVING A SWITCH INCLUDING A SHORT-CIRCUIT, IN ON STATE, BETWEEN INPUT AND OUTPUT NODES OF A GAIN APPLICATION UNIT

BACKGROUND OF THE INVENTION

1. Field of the Invention

The present disclosure relates to a photoelectric conversion device, an image pickup system, and a driving method of photoelectric conversion device.

2. Description of the Related Art

In a field of image pickup apparatuses, switching of gains may be performed for the same signal in a sequential manner. Japanese Patent Laid-Open No. 2010-016416 describes an image pickup system in which each of amplifiers provided for respective columns of a pixel array amplify a single signal with different gains, each of the amplifiers corresponding to a corresponding one of the columns, and which widens a dynamic range by selecting and using one of resulting signals in accordance with the signal level. As a method for amplifying a signal with different gains, Japanese Patent Laid-Open No. 2010-016416 describes a method in which switching of gains is performed in a single amplifier and processing is performed in a sequential manner.

However, in Japanese Patent Laid-Open No. 2010-016416, an operational amplifier, which includes an active element, is used as an amplifier. Thus, in a method in which switching of gains is performed in an amplifier in a sequential manner, a settling time for an output of the amplifier to settle depends on the responsivity of the operational amplifier. Consequently, every time a switching of gains is performed, a settling time is needed. Therefore, the operation speed of an image pickup device is limited by the responsivity of the operational amplifier.

SUMMARY OF THE INVENTION

The present disclosure provides a photoelectric conversion device, an image pickup system, and a driving method for photoelectric conversion device that increase the operation speed of an image pickup device.

According to an aspect of the present disclosure, a plurality of analog signal output units including a plurality of pixels, each of the plurality of analog signal output units configured to output an analog signal based on a pixel of the plurality of pixels; and a plurality of signal processing units; each of the plurality of signal processing units being provided correspondingly to one of the plurality of analog signal output units and including a gain application unit and an AD conversion unit, the gain application unit being configured to apply a gain to an analog signal, within the gain application unit, a portion that contributes to application of a gain to the analog signal is constituted only of passive elements, the gain application unit being configured to selectively output a first amplified signal or a second amplified signal, the first amplified signal being a signal obtained by applying a first gain to the analog signal, and the second amplified signal being a signal obtained by applying a second gain, smaller than the first gain, to the analog signal, and the AD conversion unit being configured to convert, from analog to digital, the first amplified signal or the second amplified signal output from the gain application unit.

Further features of the present disclosure will become apparent from the following description of embodiments with reference to the attached drawings.

DESCRIPTION OF THE EMBODIMENTS

First Embodiment

A first embodiment according to the present disclosure will be described with reference to drawings.

Figure 1:
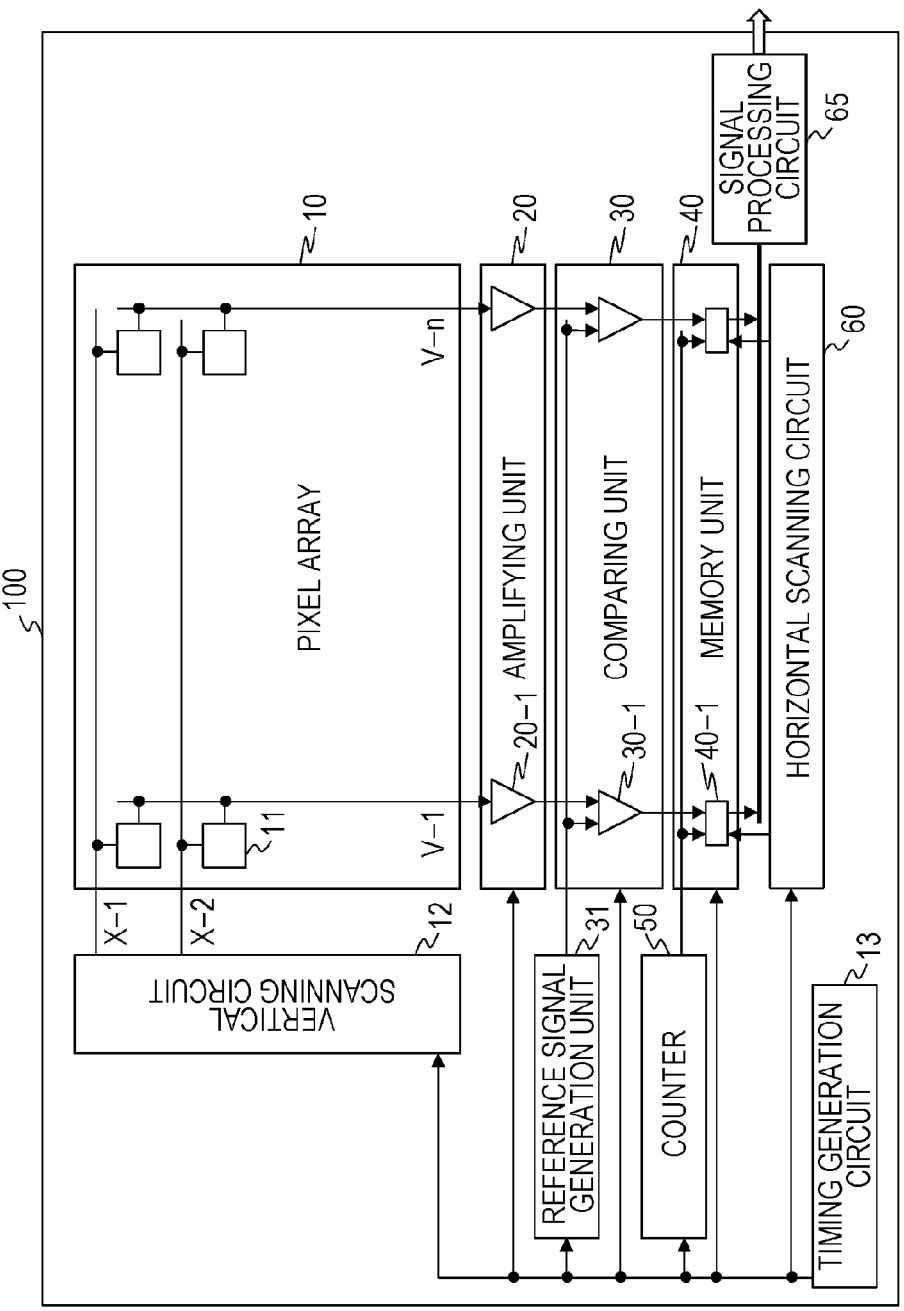
FIG. 1 is a diagram illustrating an example of the configuration of a photoelectric conversion device.

FIG. 1 is a diagram illustrating an example of the configuration of a photoelectric conversion device according to the first embodiment. A photoelectric conversion device 100 includes a pixel array 10, an amplifying portion 20, a comparing portion 30, a memory portion 40, a counter 50, a vertical scanning circuit 12, a horizontal scanning circuit 60, and a signal processing circuit 65. A timing generation circuit 13 generates a signal used to control operation of the photoelectric conversion device 100.

The pixel array 10 includes a plurality of pixels 11 that are arranged in a matrix. Output nodes of a plurality of pixels arranged in a single column in the pixel array 10 are connected to a common signal line V-n. Here, n is an integer and a common signal line V-n indicates that the common signal line V-n is the n-th line from the left of the pixel array 10. Hereinafter, elements arranged for the columns of the pixel array 10 will be denoted similarly.

The amplifying portion 20 includes a plurality of amplifiers 20-n. Each of the amplifiers 20-n amplifies a signal supplied from a corresponding signal line V-n.

The comparing portion 30 includes a plurality of column comparing units 30-n. Each of the column comparing units 30-n outputs a comparison result obtained by comparing an output from a corresponding amplifier 20-n with a reference signal supplied from a reference signal generation unit 31.

The memory portion 40 includes a plurality of column memories 40-n. Each of the column memories 40-n holds a count signal output from the counter 50 upon receiving an output from a corresponding column comparing unit 30-n.

When the horizontal scanning circuit 60 selects one of the column memories 40-n, the signal held in the selected column memory 40-n is transmitted to the signal processing circuit 65.

It may also be said in other words that each column has an analog signal output unit and a signal processing unit. The analog signal output unit includes a plurality of pixels 11 arranged for the column in the pixel array 10 and an amplifier 20-n arranged for the plurality of pixels 11. The signal processing unit has a function of performing analog-to-digital (AD) conversion on a signal output from the analog signal processing unit.

Figure 2:
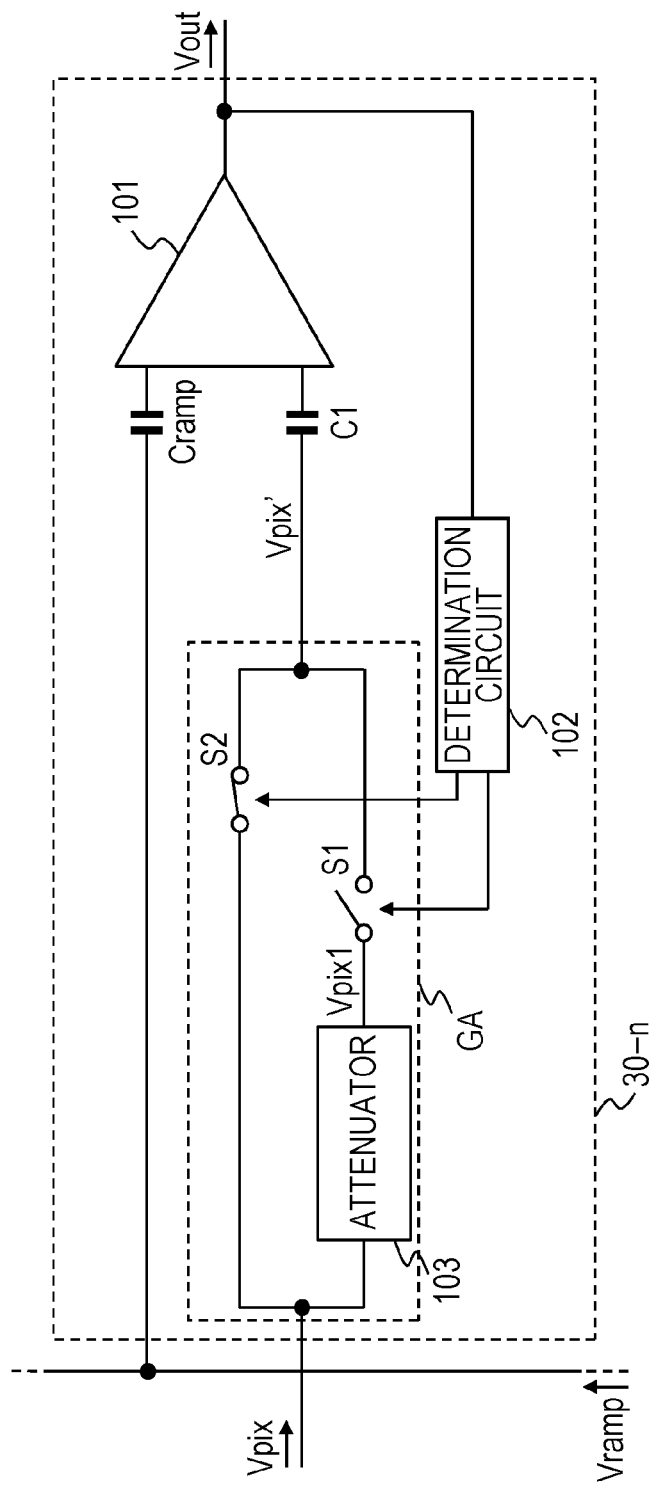
FIG. 2 is a diagram illustrating an example of the configuration of a column comparing unit.

FIG. 2 illustrates the configuration of a column comparing unit 30-n according to the first embodiment. The column comparing unit 30-n includes a comparator 101, a determination circuit 102, a gain application unit GA, and input capacitors Cramp and C1. The gain application unit GA according to the first embodiment includes an attenuator 103 and switches S1 and S2. A reference signal Vramp is input to one of input nodes of the column comparing unit 30-n via the input capacitor Cramp. An output of an amplifier 20-n is connected to the other input node of the column comparing unit 30-n either via the switch S2 and the input capacitor C1 or via the attenuator 103, the switch S1, and the input capacitor C1. An output of the comparator 101 is connected to the determination circuit 102. The determination circuit 102 performs control such that either of the switches S1 and S2 is closed in response to an output from the comparator 101. As a result, a signal obtained by amplifying an output from the amplifier 20-n using the attenuator 103 or an output from the amplifier 20-n is supplied to the comparator 101. An output of the amplifier 20-n is amplified with a gain of less than 1 and output from the attenuator 103. A signal that is supplied from the amplifier 20-n and input to the comparator 101 via the switch S2 is a signal obtained by amplifying an output from the amplifier 20-n, an analog signal, by a gain of 1.

The gain application unit GA is configured including a portion that converts the amplitude of an input signal, that is, a portion that contributes to an application of a gain to an analog signal, is constituted only of passive elements. In the first embodiment, an output from the attenuator 103 is denoted by Vpix1 and the electric potential at an input node of the input capacitor C1 is denoted by Vpix'.

In the first embodiment, for each column, an analog signal output unit, which outputs an analog signal, is constituted including a plurality of pixels 11 and an amplifier 20-n and an AD conversion unit is constituted including a column comparing unit 30-n and a column memory 40-n together with the reference signal generation unit 31 and the counter 50.

Figure 3:
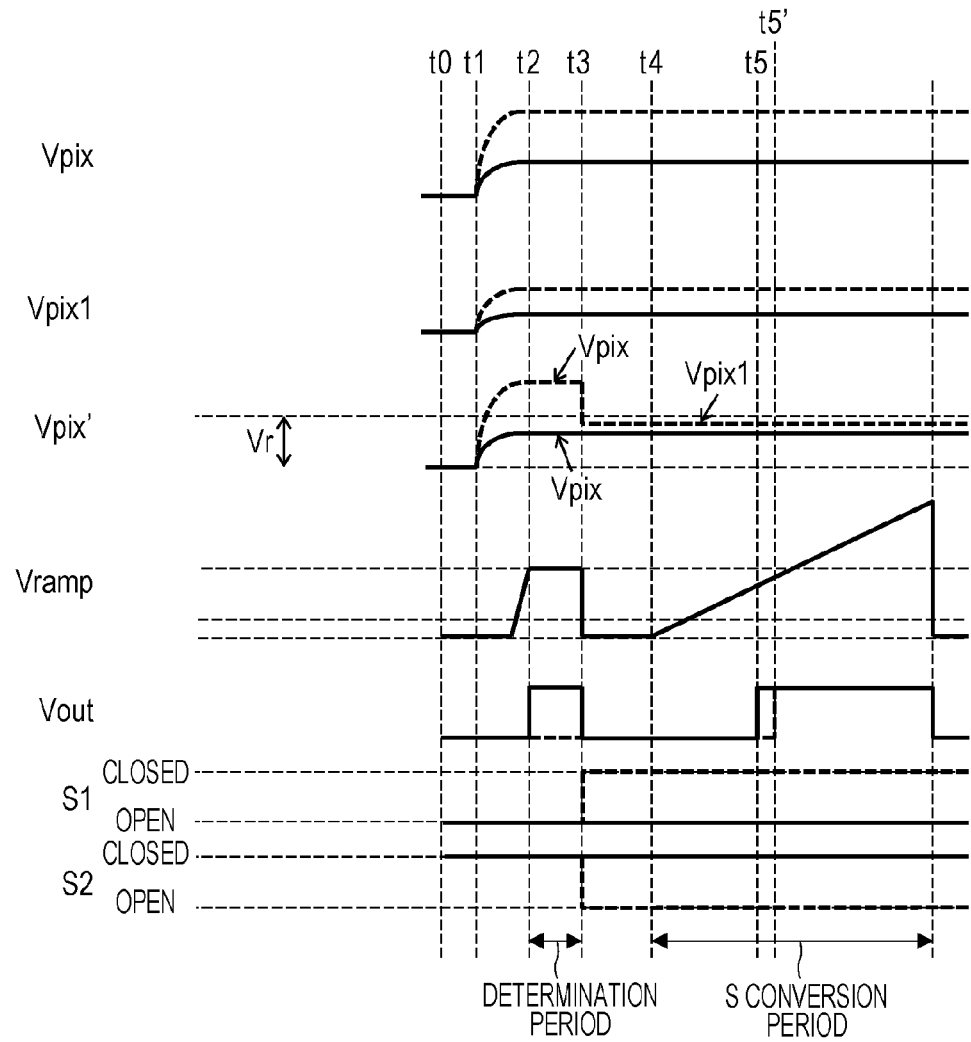
FIG. 3 is a timing diagram according to a first embodiment.

Next, operation according to the first embodiment will be described with reference to FIG. 3.

A broken line represents a case where an output Vpix of a certain amplifier 20-n is greater than a threshold described below, and a solid line represents a case where the output Vpix is smaller than the threshold.

At time t0, suppose that the output Vpix of the amplifier 20-n is zero. At time t0, the switch S1 is open and the switch S2 is closed. Thus, the output Vpix of the amplifier 20-n is supplied to a corresponding comparator 101 via the switch S2 and the input capacitor C1.

At time t1, the output Vpix of the amplifier 20-n starts to change and becomes statically determinate at time t2.

Meanwhile, the value of the reference signal Vramp becomes statically determinate to a threshold Vr by time t2. In a determination period from time t2 to time t3, if the output Vpix exceeds the threshold Vr, an output Vout of the comparator 101 remains at an L level as illustrated by a broken line. As a result, the determination circuit 102 opens the switch S2 and closes the switch S1. That is, switching is performed such that the output Vpix of the amplifier 20-n is attenuated by the attenuator 103 and is supplied to the comparator 101. If the output Vpix is smaller than the threshold Vr, the output Vout of the comparator 101 becomes an H level as illustrated by a solid line. In this case, the states of the switches S1 and S2 are unchanged from time t0. That is, in the case where the output Vpix is smaller than the threshold Vr, a signal amplified with a first gain is supplied to the comparator 101, and in the case where the output Vpix is greater than the threshold Vr, a signal amplified with a second gain is supplied to the comparator 101. In the following, a signal amplified with a first gain is referred to as a first amplified signal and a signal amplified with a second gain is referred to as a second amplified signal. In the first embodiment, the first gain is 1 and the second gain is less than 1.

From time t4, the level of the reference signal Vramp starts to change monotonically. The timing generation circuit 13 causes the counter 50 to start a counting operation in response to a start of change of the reference signal Vramp.

The output Vout of the comparator 101 is switched from the L level to the H level at time t5' in the case where the output Vpix of the amplifier 20-n is greater than the threshold Vr or at time t5 in the case where the output Vpix of the amplifier 20-n is smaller than the threshold Vr. As a result of switching the output Vout of the comparator 101 to the H level, a count signal is held by the column memory 40-n. In this manner, the output Vpix of the amplifier 20-n is converted into a digital signal.

A digital signal obtained in this manner is transmitted to the signal processing circuit 65. Although not illustrated in the first embodiment, the column memory 40-n may hold, as a flag signal, a determination result obtained in the determination period. With the flag signal, the signal processing circuit 65 and other downstream circuits are able to recognize with which gain of the gain application unit GA the digital signal is amplified.

As shown in Japanese Patent Laid-Open No. 2010-016416, in the case where switching of gains is performed in a sequential manner in an amplifier that includes an operational amplifier, since an operational amplifier is an active circuit, a time period until when an output of the amplifier becomes statically determinate depends on the responsivity of the operational amplifier. In general, since lower power consumption is desired for image capturing apparatuses, it is not practical to increase power consumption so as to improve the responsivity of an operational amplifier.

In contrast, according to the first embodiment, even for a signal whose level exceeds a threshold, the gain application unit GA applies a gain to the signal using only passive elements. Thus, the operation speed of a photoelectric conversion device may be increased while preventing power consumption from increasing.

In the first embodiment, a signal level of an analog signal is determined in the determination period. Based on the determination result, switching of the gains of the gain application unit GA is performed. As a result, in contrast to a case where processing is performed without switching the gain in an S conversion period, the length of an S conversion period in the first embodiment may be shortened. Thus, the operation speed of an image capturing apparatus may further be increased. If the gain application unit GA attenuates the output Vpix of an amplifier 20-$n$ to reduce the value by half, a range of change of the reference signal Vramp in the S conversion period may be reduced by half. Therefore, the length of the S conversion period may be reduced by half.

Second Embodiment

In the following, differences between the first embodiment and a second embodiment will be mainly described. The description on portions in common with the first embodiment will be omitted.

Figure 4:
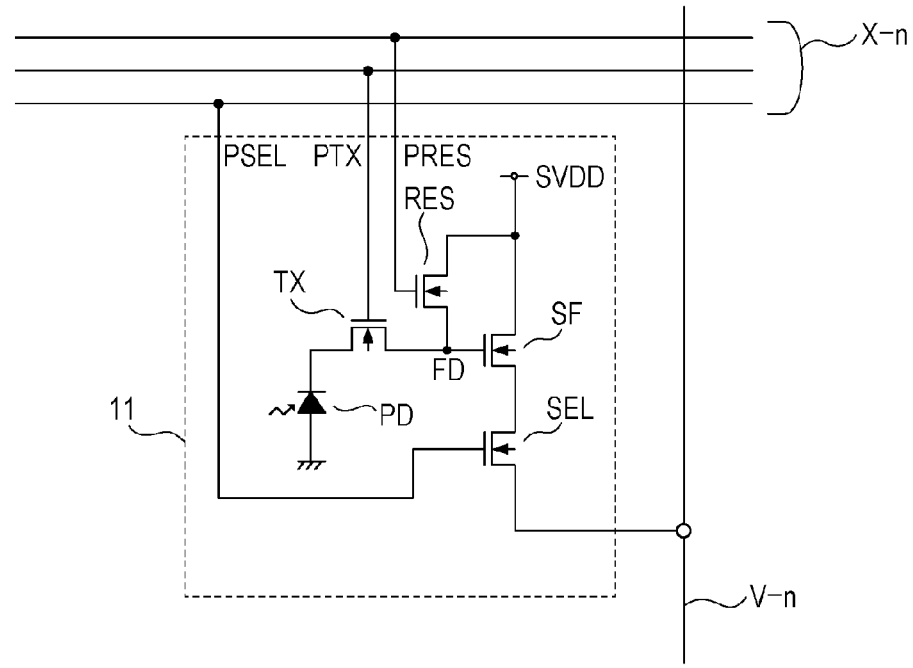
FIG. 4 is a diagram illustrating an example of the configuration of a pixel.

FIG. 4 is a diagram illustrating a pixel 11 according to the second embodiment. The pixel 11 includes a photodiode PD, an amplifying transistor SF, a transfer transistor TX, a reset transistor RES, and a select transistor SEL. The transfer transistor TX, the reset transistor RES, and the select transistor SEL are set to be conducting/nonconducting by signals PTX, PRES, and PSEL, respectively. The ground potential is applied to the anode of the photodiode PD. The cathode of the photodiode PD is connected to a floating diffusion portion FD via the transfer transistor TX. The gate of the amplifying transistor SF is connected to the floating diffusion portion FD and also to a power source SVDD via the reset transistor RES. One of main nodes of the amplifying transistor SF is connected to the power source SVDD, and the other main node is connected to an output node PIXOUT via the select transistor SEL.

Figure 5:
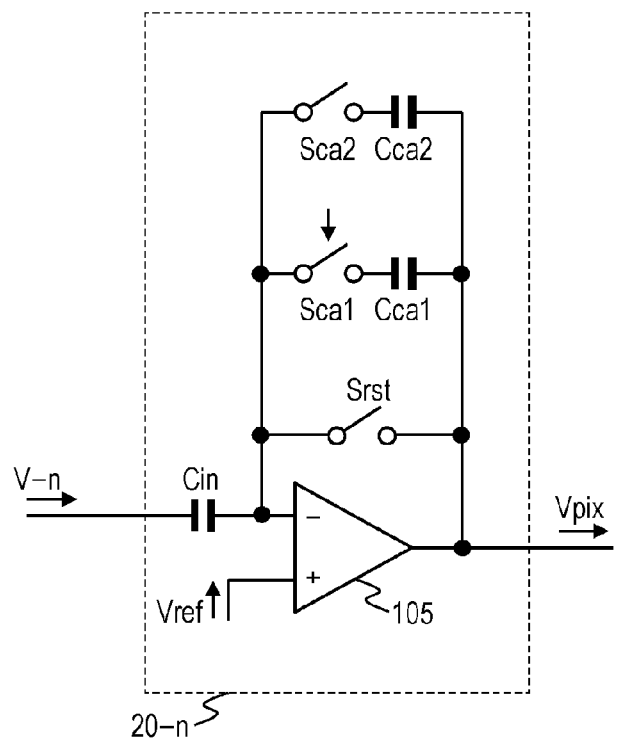
FIG. 5 is a diagram illustrating an example of the configuration of an amplifier.

FIG. 5 illustrates the configuration of an amplifier 20-$n$ according to the second embodiment. The amplifier 20-$n$ includes a differential amplifier 105, an input capacitor Cin, feedback capacitors Cca1 and Cca2, and switches Sca1, Sca2, and Srst. To a noninverting input node of the differential amplifier 105, a reference voltage Vref is applied. An inverting input node of the differential amplifier 105 is connected to a corresponding signal line V-$n$ via the input capacitor Cin. The inverting input node and an output node of the differential amplifier 105 are connected to each other via the switch Srst; the switch Sca1 and the feedback capacitor Cca1; and the switch Sca2 and the feedback capacitor Cca2. Switching of the gains of the amplifier 20-$n$ may be performed by controlling conduction states of the switches Sca1 and Sca2.

Operation according to the second embodiment will be described with reference to FIG. 6.

At time t0, the switch S1 is open and the switch S2 is closed. Thus, the output Vpix of the amplifier 20-$n$ is supplied to a corresponding comparator 101 via the switch S2 and the input capacitor C1.

At time t0, the level of the signal PSEL becomes an H level and the select transistor SEL is switched on. As a result, the amplifying transistor SF operates as a source follower circuit together with a power source provided for the signal line V-$n$ corresponding to the amplifier 20-$n$, not shown.

At time t1, the level of the signal PRES becomes an H level and the reset transistor RES is switched on. As a result, the floating diffusion portion FD is reset and the electric potential of the signal line V-$n$ changes in response to the electric potential of the floating diffusion portion FD. The output of the pixel 11 at this time is a signal mainly including a noise component due to resetting of the floating diffusion portion FD.

At time t1, the level of a signal PSrst also becomes an H level, and the switch Srst in the amplifier 20-$n$ is closed. As a result, input and output terminals of the differential amplifier 105 are short-circuited, and one of the nodes of the input capacitor Cin is reset by an output of the differential amplifier 105. Thereafter, when the level of the signal PSrst becomes an L level, an electric-potential difference between the noise component due to resetting of the floating diffusion portion FD and the output Vpix of the amplifier 20-$n$ is held by the input capacitor Cin.

At time t2, a signal level of the reference signal Vramp is changed to a reference level.

At time t3, the signal level of the reference signal Vramp is changed at a predetermined rate with respect to time. The timing generation circuit 13 causes the counter 50 to start a counting operation in response to a start of change of the reference signal Vramp. Thereafter, when the value of the reference signal Vramp exceeds the output Vpix of the amplifier 20-$n$, the output Vout of the comparator 101 becomes the H level. When the output Vout becomes the H level, a count signal output from the counter 50 is held by a corresponding column memory 40-$n$. Here, the signal held by the column memory 40-$n$ corresponds to noise due to the amplifier 20-$n$. In this manner, the noise due to the amplifier 20-$n$ is converted into a digital signal.

At time t4, the change of the value of the reference signal Vramp is stopped and the value of the reference signal Vramp is returned to its initial value. Then, the output Vout of the comparator 101 changes to the L level.

At time t5, the level of the signal PTX is changed to an H level. As a result, the transfer transistor TX is switched on and the electric charge stored in the photodiode PD is transferred to the floating diffusion portion FD. The electric potential of the floating diffusion portion FD changes according to the amount of electric charge transferred to the floating diffusion portion FD. In response to this change in the electric potential of the floating diffusion portion FD, the electric potential of the signal line V-$n$ also changes. Similarly, the output Vpix of the amplifier 20-$n$ also changes. The output Vpix of the amplifier 20-$n$ is a signal obtained by amplifying a signal obtained by reducing a noise component from the output of the pixel 11, the noise component being due to resetting of the floating diffusion portion FD. That is, ideally, a signal whose noise component due to the pixel 11 is eliminated is amplified.

At time t6, the level of the reference signal Vramp becomes statically determinate to the threshold Vr. If the output Vpix exceeds the threshold Vr, the output Vout of the comparator 101 remains at the L level as illustrated by a broken line. As a result, the determination circuit 102 opens the switch S2 and closes the switch S1. That is, the output Vpix of the amplifier 20-$n$ is attenuated by the attenuator 103 and switching is performed such that the attenuated output Vpix is supplied to the comparator 101. If the output Vpix is smaller than the threshold Vr, the output Vout of the comparator 101 becomes the H level as illustrated by a solid line. In this case, the states of the switches S1 and S2 are unchanged from time t0.

From time t8, the level of the reference signal Vramp starts to change at a predetermined rate with respect to time.

The timing generation circuit 13 causes the counter 50 to start a counting operation in response to a start of change of the reference signal Vramp.

The output Vout of the comparator 101 is switched from the L level to the H level at time t9' in the case where the output Vpix of the amplifier 20-*n* is greater than the threshold Vr and at time t9 in the case where the output Vpix of the amplifier 20-*n* is smaller than the threshold Vr. As a result of switching the output Vout of the comparator 101 to the H level, a count signal is held by the column memory 40-*n*. In this manner, the output Vpix of the amplifier 20-*n* is converted into a digital signal. A digital signal having a reduced amount of noise is obtained by performing processing at, for example, the signal processing circuit 65 on the difference between the digital signal held by the column memory 40-*n* in a period from time t3 to time t4 and the digital signal held at time t9 or time t9', the noise being due to the amplifier 20-*n*.

According to the second embodiment, as in the first embodiment, even for a signal whose level exceeds a threshold, a portion that contributes to application of a gain to an analog signal in the gain application unit GA is constituted only of passive elements. Thus, the operation speed of a photoelectric conversion device may be increased while preventing power consumption from increasing.

Furthermore, according to the second embodiment, since the amount of noise due to resetting of the floating diffusion portion FD and that of noise due to the amplifier 20-*n* may be reduced, a signal having a high S/N ratio may be obtained.

Third Embodiment

Figure 7:
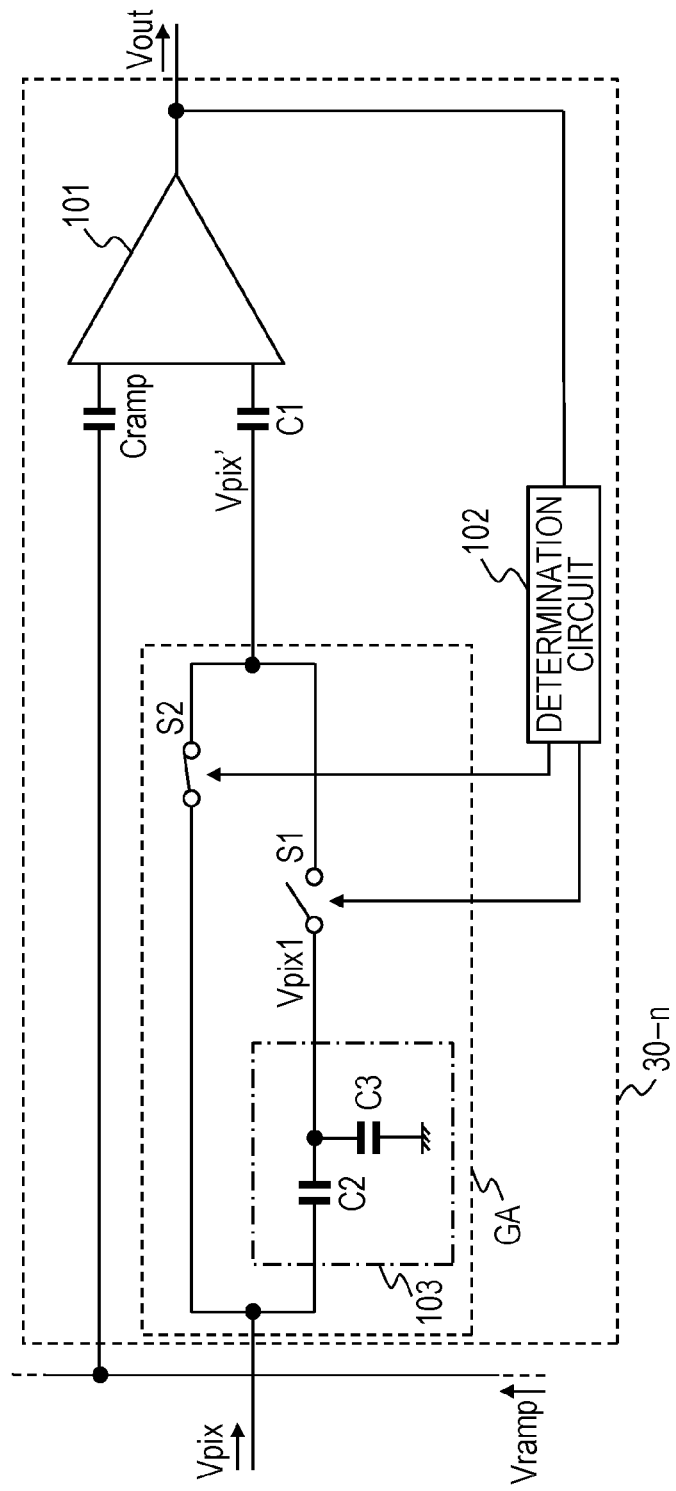
FIG. 7 is a diagram illustrating an example of the configuration of a column comparing unit.

FIG. 7 is a diagram illustrating the configuration of a column comparing unit 30-*n* according to a third embodiment. The third embodiment is different from the first and second embodiments in that the attenuator 103 includes two capacitors C2 and C3. The description of portions in common with the above-described embodiments will be omitted.

One of the nodes of the capacitor C2, which is a first capacitive element, is connected to a corresponding analog signal output unit. The other node of the capacitor C2 is connected to one of the nodes of the capacitor C3, which is a second capacitive element, and the switch S1. A fixed electric potential is applied to the other node of the capacitor C3. With such a configuration, the gain of the attenuator 103 is determined using the ratio between the capacitances of the capacitors C2 and C3.

Figure 6:
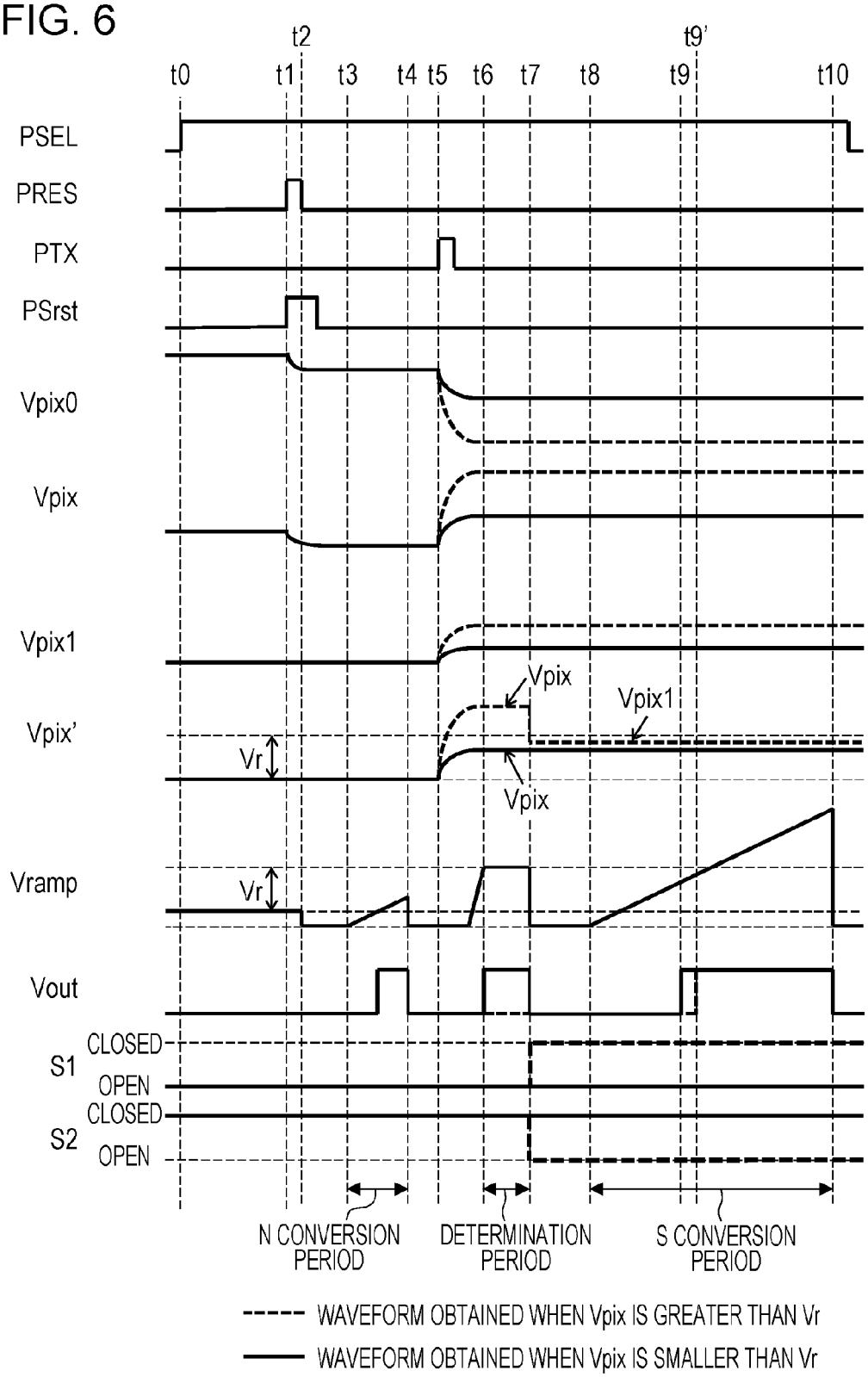
FIG. 6 is a timing chart according to a second embodiment.

With the configuration of the attenuator 103 according to the third embodiment, it is necessary to temporarily close the switch S1 before time t2 in FIG. 6 in order to reset the capacitors C2 and C3. Except for this point, the same operation as that illustrated in FIG. 6 may be executed.

Fourth Embodiment

Figure 8:
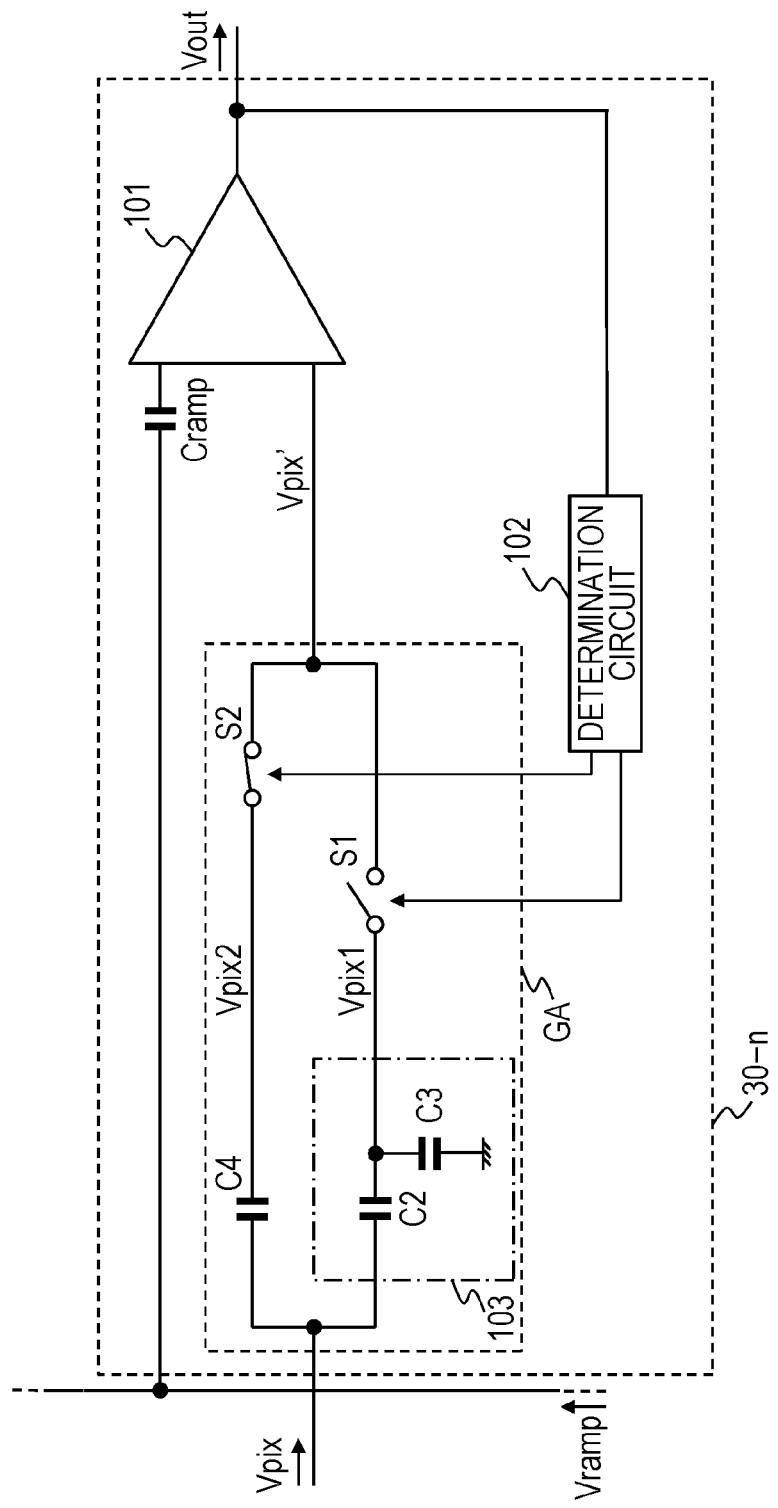
FIG. 8 is a diagram illustrating an example of the configuration of a column comparing unit.

FIG. 8 is a diagram illustrating the configuration of a column comparing unit 30-*n* according to a fourth embodiment. The fourth embodiment is different from the third embodiment in that the gain application unit GA does not include the input capacitor C1 but includes a capacitor C4.

The operation of a photoelectric conversion device according to the fourth embodiment may be the same as that of a photoelectric conversion device according to the third embodiment.

Fifth Embodiment

A fifth embodiment of the present disclosure will be described.

Figure 9:
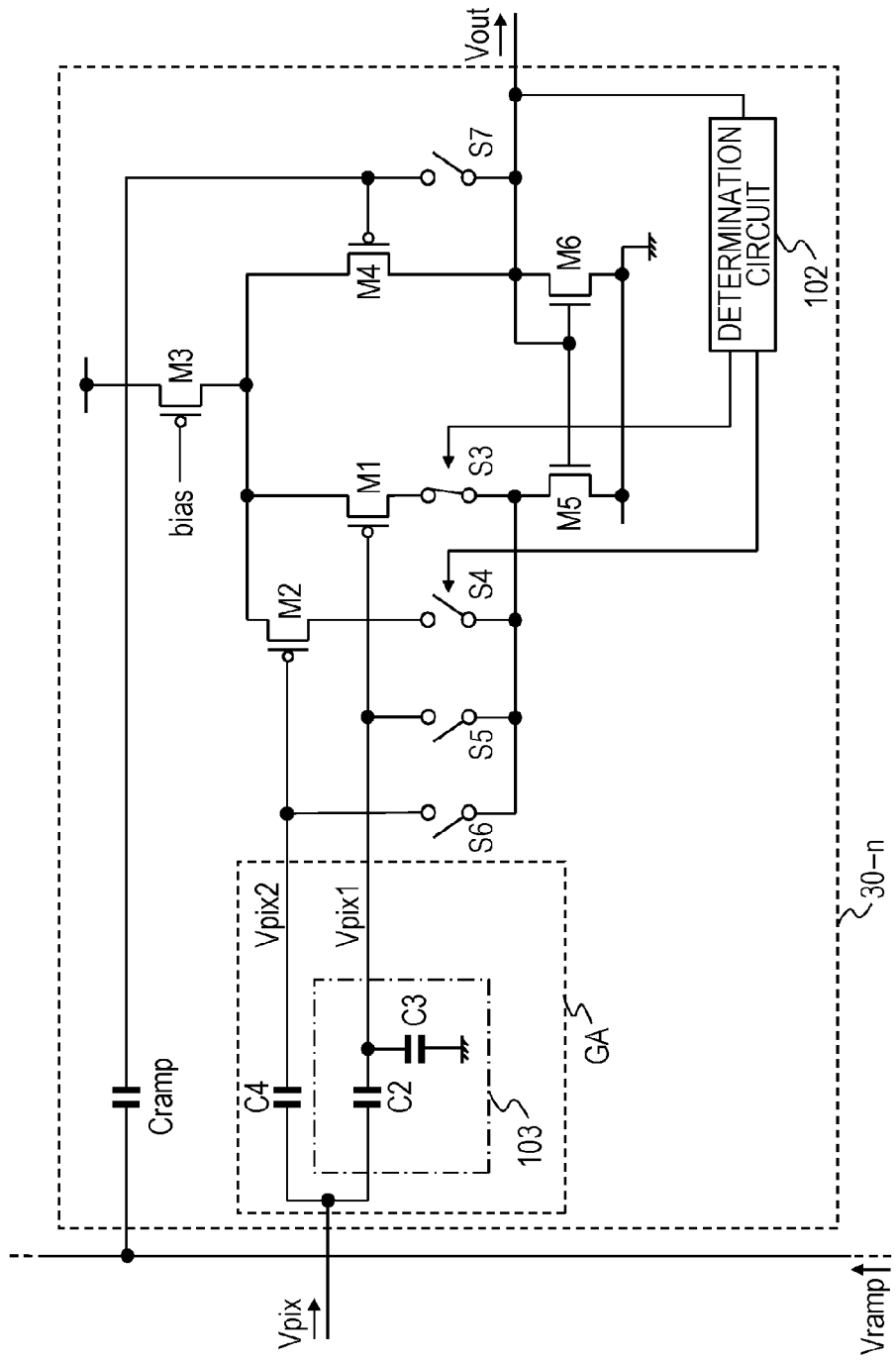
FIG. 9 is a diagram illustrating an example of the configuration of a column comparing unit.

FIG. 9 is a diagram illustrating the configuration of a column comparing unit 30-*n* according to the fifth embodiment. The column comparing unit 30-*n* according to the fifth embodiment is different from that illustrated in FIG. 8 in that the configuration used to perform switching between a path through which the output Vpix of the amplifier 20-*n* is supplied to the comparator 101 via the capacitor C4 and a path through which the output Vpix of the amplifier 20-*n* is supplied to the comparator 101 via the capacitor C2 is shared by the comparator 101 and the gain application unit GA. The description of portions in common with the above-described embodiments will be omitted.

The comparator 101 includes transistors M1 to M6. The transistor M1 and the transistor M4 constitute a differential pair, the transistor M1 being a first input transistor and the transistor M4 being a second input transistor. The transistor M2 and the transistor M4 also constitute a differential pair, the transistor M2 being a third input transistor. The transistors M1 and M2 are connected in parallel to each other. The transistor M3 functions as a tail current source for the differential pairs. The transistors M5 and M6 function as current sources for the transistors M1, M2, and M4. One of main nodes of the transistor M1 is connected to the transistor M5 via a switch S3 and the other main node is connected to the transistor M3. A control node of the transistor M1 is connected to a common contact between the capacitors C2 and C3, to an input terminal of the column comparing unit 30-*n* via the capacitor C2, and to a common node between the transistor M5 and the switch S3 via a switch S5. One of main nodes of the transistor M2 is connected to the transistor M5 via a switch S4 and the other main node is connected to the transistor M3. A control node of the transistor M2 is connected to an input terminal of the column comparing unit 30-*n* via the capacitor C4 and to a common node between the transistor M5 and the switch S3 via a switch S6. One of main nodes of the transistor M4 is connected to the transistor M3 and the other main node is connected to the transistor M6. A control node of the transistor M4 is connected to, via the input capacitor Cramp, a wiring line through which the reference signal Vramp is supplied, to the other main node of the transistor M4 via a switch S7, and to the transistor M6 and an output node of the column comparing unit 30-*n*. The switches S3 and S4 are controlled by the determination circuit 102.

Figure 10:
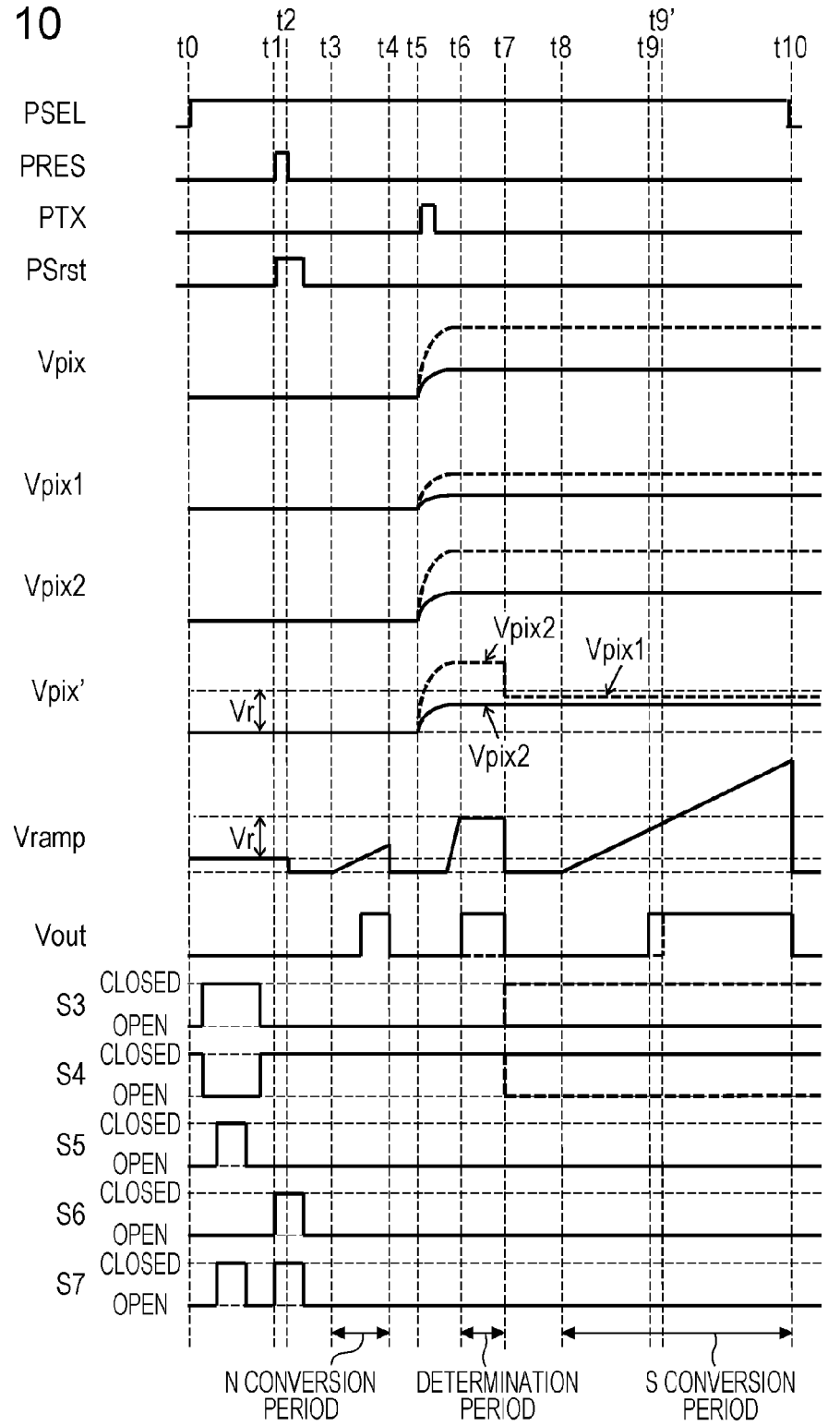
FIG. 10 is a timing chart according to a fifth embodiment.

With reference to FIG. 10, an operation of a photoelectric conversion device according to the fifth embodiment will be described.

The operation illustrated in FIG. 10 is different from that illustrated in FIG. 6 in that the operation of the switches S1 and S2 is not included and operation of the switches S3 to S7 is included. Here, the description of the same portions as those in FIG. 6 is omitted and only the portions that are different from those in FIG. 6 will be described.

The capacitors C2 to C4 are reset in a period from time t0 to time t1, after the level of the signal PSEL becomes the H level at time t0.

First, the switch S3 is closed and the switch S4 is opened. As a result, the transistors M1 and M5 are electrically connected to each other and the transistors M1 and M4 constitute an active differential pair for the comparator 101.

Next, the switches S5 and S7 are closed. As a result, the electric potential of the capacitor C2 and that of the capacitor C3 are reset to the electric potential of the common node between the switch S3 and the transistor M5. In addition, the electric potential of one of nodes of the input capacitor Cramp is reset to the electric potential of a common contact between the transistors M4 and M6.

Next, the switch S3 is opened and the switch S4 is closed. As a result, switching is performed such that the transistors M2 and M4 become the active differential pair for the comparator 101.

Next, the switches S6 and S7 are closed. As a result, the electric potential of a capacitor C6 is reset to the electric potential of a common contact between the switch S4 and the transistor M5. In addition, the electric potential of the one of the nodes of the input capacitor Cramp is reset to the electric potential of the common contact between the transistors M4 and M6 again.

Thereafter, since the switch S4 is closed until the determination period ends at time t7, the output Vpix of the amplifier 20-n may be input to the comparator 101 via the capacitor C4. That is, as in the operation illustrated in FIG. 6, the output Vpix of the amplifier 20-n is supplied to the comparator 101 via a path with a higher gain between the two paths.

In the determination period, in the case where the output Vpix of the amplifier 20-n is smaller than the threshold Vr, the switch S3 remains open and the switch S4 remains closed as illustrated by solid lines. In contrast, in the case where the output Vpix of the amplifier 20-n exceeds the threshold Vr, the switch S4 is opened and the switch S3 is closed as illustrated by broken lines. As a result, the output Vpix of the amplifier 20-n is supplied to the comparator 101 via the attenuator 103 that includes the capacitors C2 and C3.

Also with the fifth embodiment, a gain is applied to a signal to be input to the comparator 101, using only passive elements. Thus, the operation speed of a photoelectric conversion device may be increased while preventing power consumption from increasing.

In the fifth embodiment, before resetting of the capacitor C4, the capacitors C2 and C3 are reset; however, such resetting may be performed in reverse order. Note that, in that case, after the capacitors C2 and C3 have been reset, it is necessary to set one of differential pairs as the active differential pair. In terms of increasing an operation speed, the operation illustrated in FIG. 10 is more advantageous than resetting the capacitors C4 prior to resetting the capacitors C2 and C3.

Sixth Embodiment

Figure 11:
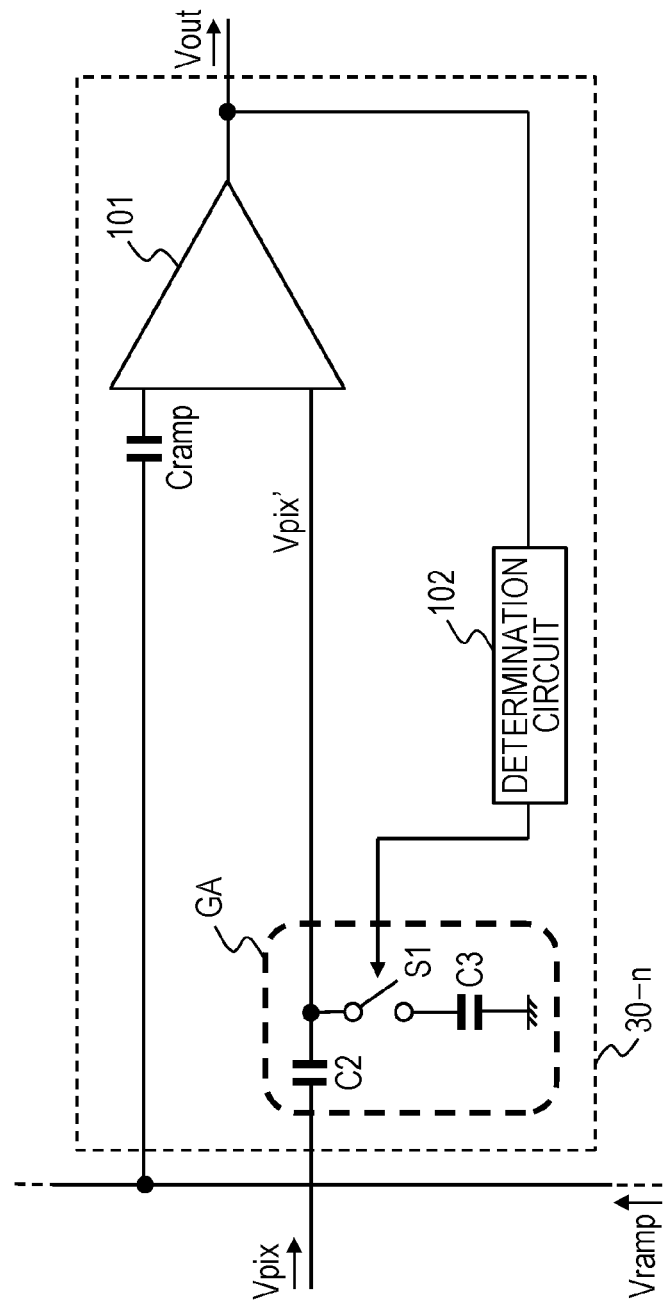
FIG. 11 is a diagram illustrating an example of the configuration of a column comparing unit.

FIG. 11 is a diagram illustrating the configuration of a column comparing unit 30-n according to a sixth embodiment. The column comparing unit 30-n illustrated in FIG. 8 is configured such that one of the input nodes of the comparator 101 is connected to one of the input nodes of the column comparing unit 30-n via two paths that are switched between using the switches S1 and S2. In contrast, in the sixth embodiment, there is just one path between one of the input nodes of the comparator 101 and one of the input nodes of the column comparing unit 30-n. In the sixth embodiment, the column comparing unit 30-n has a configuration in which there is no path that bypasses the attenuator 103 and switching of gains is performed. The description of portions in common with the above-described embodiments will be omitted.

Figure 12:
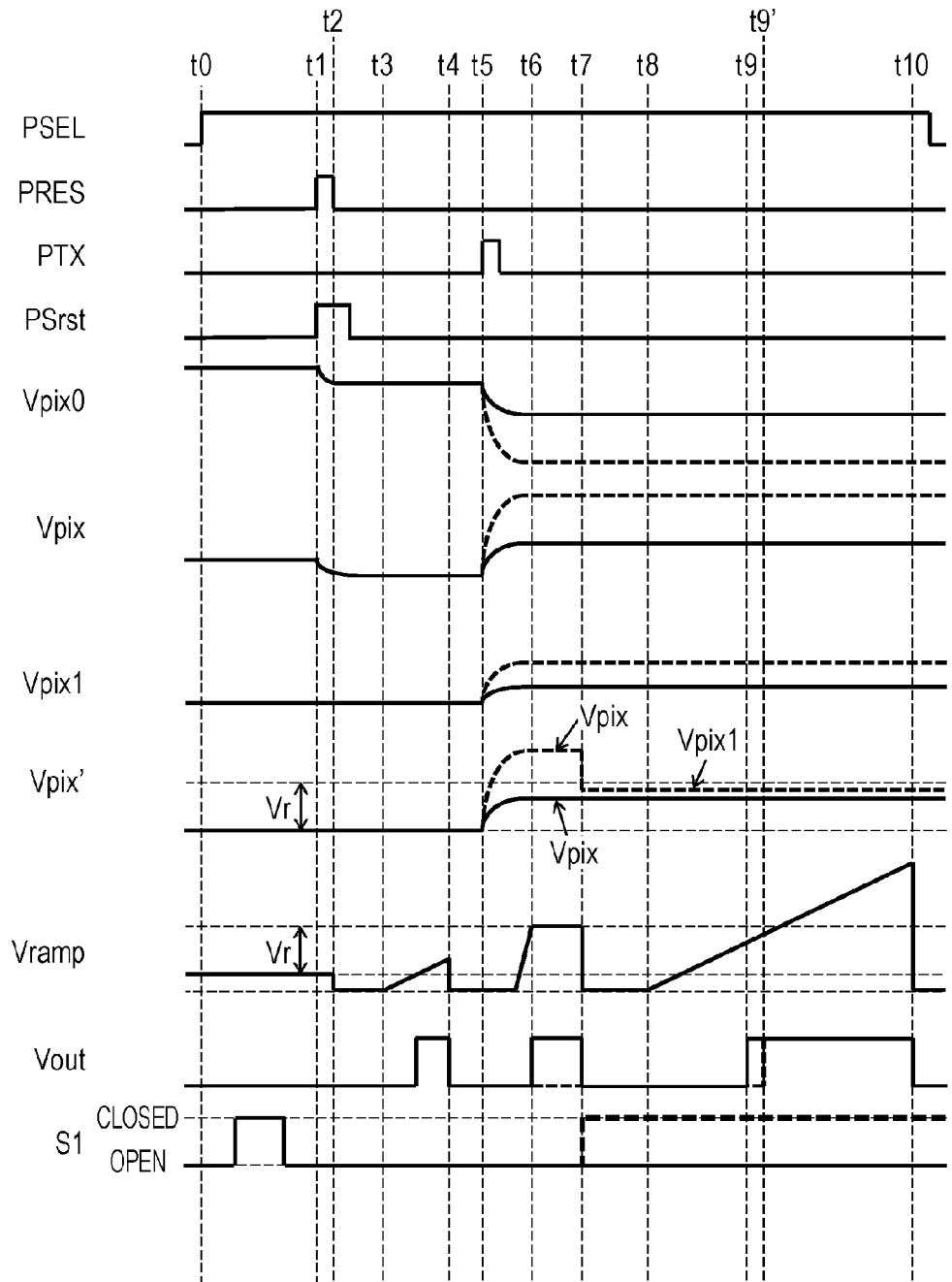
FIG. 12 is a timing chart according to a sixth embodiment.

FIG. 12 is a timing diagram used to describe operation according to the sixth embodiment. The timing diagram illustrated in FIG. 12 is different from that illustrated in FIG. 6 in that the switch S1 is temporarily closed during a time period from time t0 to time t1. By closing the switch S1, the capacitors C2 and C3 are reset. The operation illustrated in FIG. 12 may be the same as that illustrated in FIG. 6, except for the operation of the switch S1.

According to the sixth embodiment, while the power consumption is prevented from being increased, the operation speed of a photoelectric conversion device may be increased. Furthermore, since the path from the amplifier 20-n to the comparator 101 is simplified, a photoelectric conversion device may be miniaturized.

Seventh Embodiment

Figure 13:
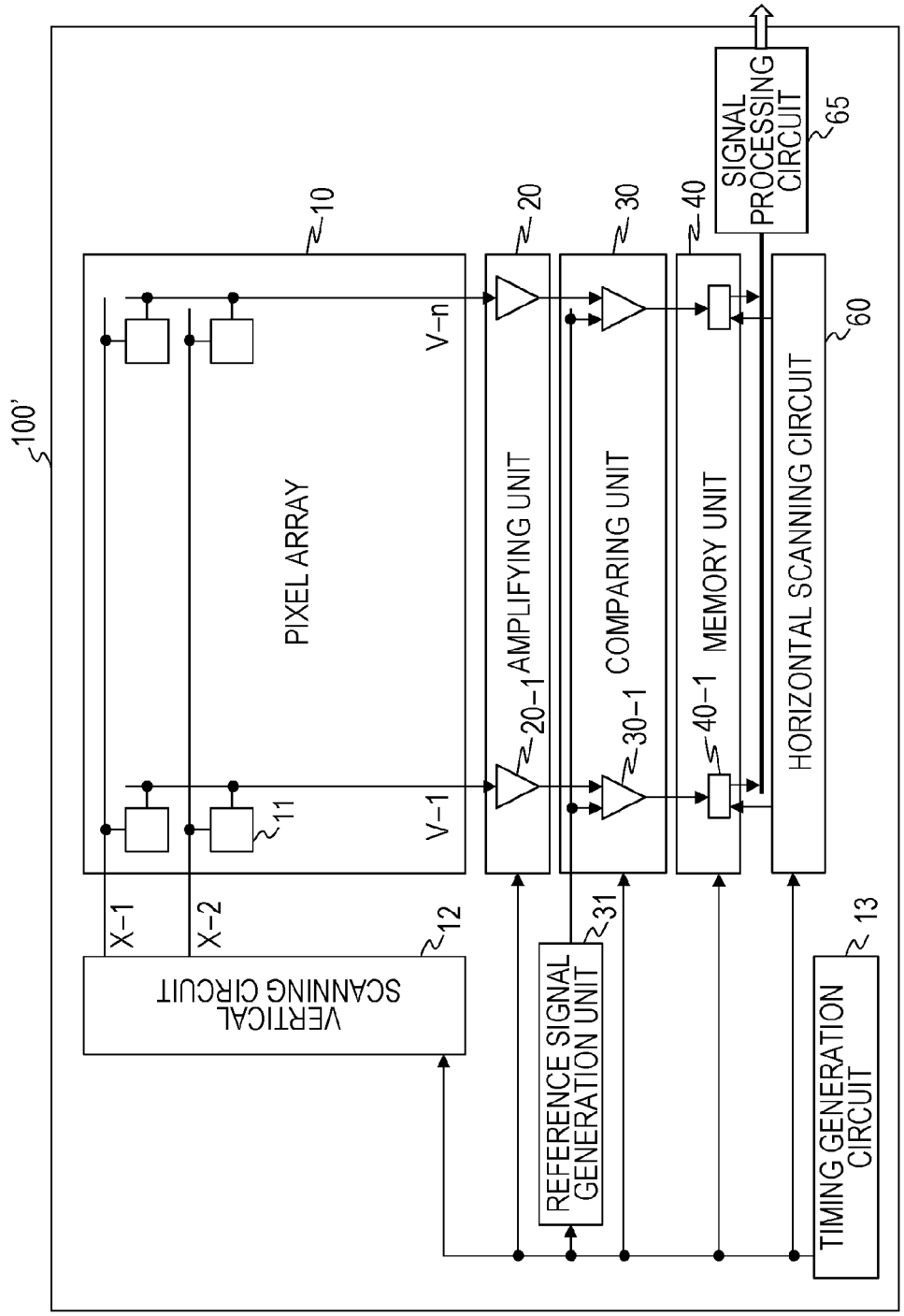
FIG. 13 is a diagram illustrating an example of the configuration of a photoelectric conversion device.

FIG. 13 is a diagram illustrating the configuration of a photoelectric conversion device 100' according to a seventh embodiment. The photoelectric conversion device 100' illustrated in FIG. 13 is different from the photoelectric conversion device 100 illustrated in FIG. 1 in that the counter 50 is omitted. The description of portions in common with the above-described embodiments will be omitted.

Figure 14:
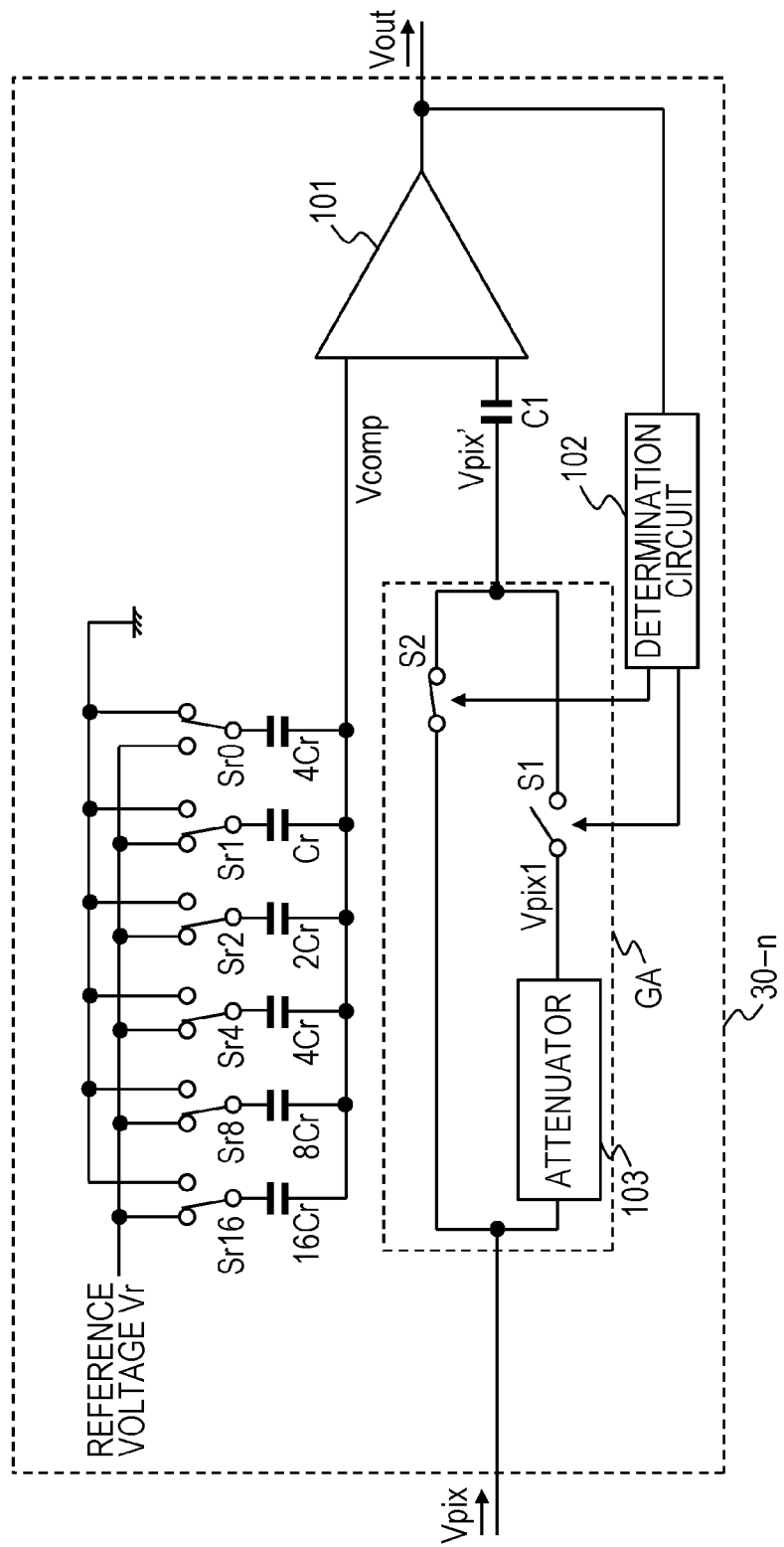
FIG. 14 is a diagram illustrating an example of the configuration of a column comparing unit.

FIG. 14 is a diagram illustrating the configuration of a column comparing unit 30-n according to the seventh embodiment. The column comparing unit 30-n illustrated in FIG. 14 is different from that illustrated in FIG. 2 in that a comparison voltage generation unit 104 is included. The configuration between the other input node of the comparator 101 and an output terminal of the amplifier 20-n is the same as that illustrated in FIG. 2.

The comparison voltage generation unit 104 includes a plurality of capacitors arranged in parallel to each other and switches each of which is arranged in series with a corresponding one of the capacitors. Each of the capacitors is selectively connected to a terminal for a ground voltage GND or a terminal for a reference voltage Vr1 (hereinafter also referred to as a threshold Vr1) via a corresponding one of the switches. Here, an example is illustrated in which six capacitors are arranged in parallel to each other and the capacitances of the capacitors are 16Cr, 8Cr, 4Cr, 2Cr, Cr, and 4Cr from the left in the drawing. In the seventh embodiment, the reference signal generation unit 31 applies the reference voltage Vr1 to the column comparing unit 30-n of each of the columns. By switching connection terminals for each of the plurality of capacitors having capacitances of 16Cr, 8Cr, 4Cr, 2Cr, Cr, and 4Cr by using a corresponding one of the switches, the column comparing unit 30-n operates as a successive approximation AD converter.

Figure 15:
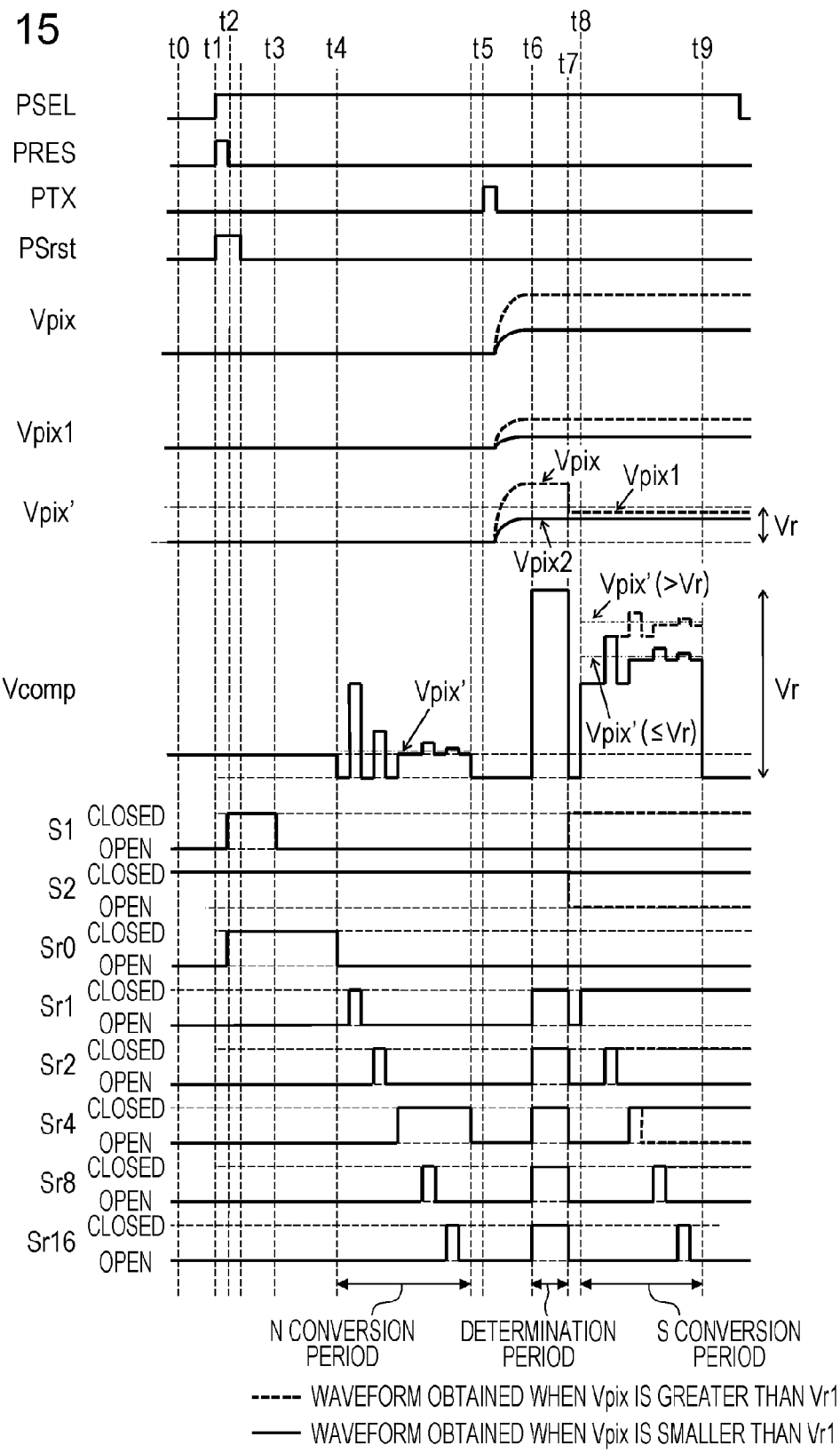
FIG. 15 is a timing chart according to a seventh embodiment.

Operation according to the seventh embodiment will be described with reference to FIG. 15.

At time t0, the levels of all the signals PSEL, PRES, PTX, and PSrst are at an L level. Thus, the output Vpix of the amplifier 20-n is also at the L level.

In addition, at time t0, the switch S2 is in a closed state and switches S1, Sr0, Sr1, Sr2, Sr4, Sr8, and Sr16 are in an open state. Here, for each of the switches Sr0, Sr1, Sr2, Sr4, Sr8, and Sr16, an open state refers to a state in which the ground potential is applied to a capacitor corresponding to the switch, and a closed state refers to a state in which the reference voltage Vr1 is applied to the capacitor corresponding to the switch.

The following description is made for a case where each amplifier 20-n of the amplifying portion 20 has a configuration illustrated in FIG. 5.

At time t1, the level of the signal PSEL becomes the H level and the select transistor SEL is switched on. As a result, the amplifying transistor SF operates as a source follower circuit together with a power source provided for the signal line V-n corresponding to the amplifier 20-n, not shown.

At time t1, the level of the signal PRES becomes the H level and the reset transistor RES is switched on. As a result, the floating diffusion portion FD is reset and the electric potential of the signal line V-n changes in response to the electric potential of the floating diffusion portion FD. The output of the pixel 11 at this time is a signal mainly including a noise component due to a resetting of the floating diffusion portion FD.

At time t1, the level of the signal PSrst also becomes the H level, and the switch Srst in the amplifier 20-n is closed. As a result, the input and output terminals of the differential amplifier 105 are short-circuited, and one of the nodes of the input capacitor Cin is reset by an output of the differential amplifier 105. Thereafter, when the level of the signal PSrst becomes the L level, an electric-potential difference between the noise component due to the resetting of the floating diffusion portion FD and the output Vpix of the amplifier 20-n is held by the input capacitor Cin.

At time t3, the switch S1 enters the open state and only a signal that does not flow via the attenuator 103 is supplied to the comparator 101 via the input capacitor C1.

At time t4, the switch Sr0 enters the open state and the ground potential is applied to the capacitor corresponding to the switch Sr0.

After the switch Sr0 enters the open state at time t4, an AD conversion period starts. In the AD conversion period, switching is performed successively for the switches Sr1, Sr2, Sr4, Sr8, and Sr16 in a sequential manner and an analog signal supplied to the comparator 101 is converted into a digital signal. The operation here is similar to that performed by a known successive approximation AD converter, and thus a detailed description will be omitted. Through operation performed in an N conversion period, noise due to the amplifier 20-n is converted into a digital signal.

At time t5, the level of the signal PTX is changed to the H level. As a result, the transfer transistor TX is switched on and electric charge accumulated in the photodiode PD is transferred to the floating diffusion portion FD. The electric potential of the floating diffusion portion FD changes according to the amount of electric charge transferred to the floating diffusion portion FD. In response to this change in the electric potential of the floating diffusion portion FD, the electric potential of the signal line V-n also changes. Similarly, the output Vpix of the amplifier 20-n also changes. The output Vpix of the amplifier 20-n is a signal obtained by amplifying a signal obtained by reducing a noise component from the output of the pixel 11, the noise component being caused due to resetting of the floating diffusion portion FD. That is, ideally, a signal whose noise component due to the pixel 11 is eliminated is amplified.

At time t6, the switches Sr1, Sr2, Sr4, Sr8, and Sr16 enter the closed state. Here, suppose that the threshold Vr is applied to one of the input nodes of the comparator 101. In a determination period until time t7, the threshold Vr and the output Vpix of the amplifier 20-n are compared with each other, the output Vpix being supplied to the other input node of the comparator 101.

In the determination period, a dotted line represents a case where the output Vpix exceeds the threshold Vr, and a solid line represents a case where the output Vpix is smaller than the threshold Vr. In FIG. 15, in the case where the output Vpix is equal to the threshold Vr, the switches are operated in the same way as in the case where the output Vpix is smaller than the threshold Vr; however, the switches may be operated instead in the same way as in the case where the output Vpix exceeds the threshold Vr.

In the case where the output Vpix exceeds the threshold Vr1, the switch S1 enters the closed state and the switch S2 enters the open state. As a result, the output Vpix of the amplifier 20-n is attenuated by the attenuator 103 and the resulting signal, which is a second amplified signal, is supplied to the comparator 101.

In contrast, in the case where the output Vpix is smaller than the threshold Vr1, the conduction states of the switches S1 and S2 are maintained.

From time t8 after the switches Sr1, Sr2, Sr4, Sr8, and Sr16 enter the open state, an S conversion period starts. In the S conversion period, a digital signal is obtained by performing operation similar to that of a known successive approximation AD converter.

A digital signal having a reduced amount of noise is obtained by performing processing on the difference between the digital signal obtained in the N conversion period and the digital signal obtained in the S conversion period, the noise being caused due to the amplifier 20-n.

According to the seventh embodiment, as in the first embodiment, the portion of the attenuator 103 that contributes to application of a gain to a signal is constituted only of passive elements. Thus, the operation speed of a photoelectric conversion device may be increased while preventing power consumption from increasing.

Furthermore, according to the seventh embodiment, since the amount of noise due to resetting of the floating diffusion portion FD and that of noise due to the amplifier 20-n may be reduced, a signal having a high S/N ratio may be obtained.

Eighth Embodiment

The above-described embodiments describe that the gain application unit GA includes the attenuator 103 and the attenuator 103 multiplies an analog signal by a gain less than 1. However, instead of the attenuator 103, an amplifier configured to apply a gain greater than 1 may be provided. The description of portions in common with the above-described embodiments will be omitted.

Figure 16:
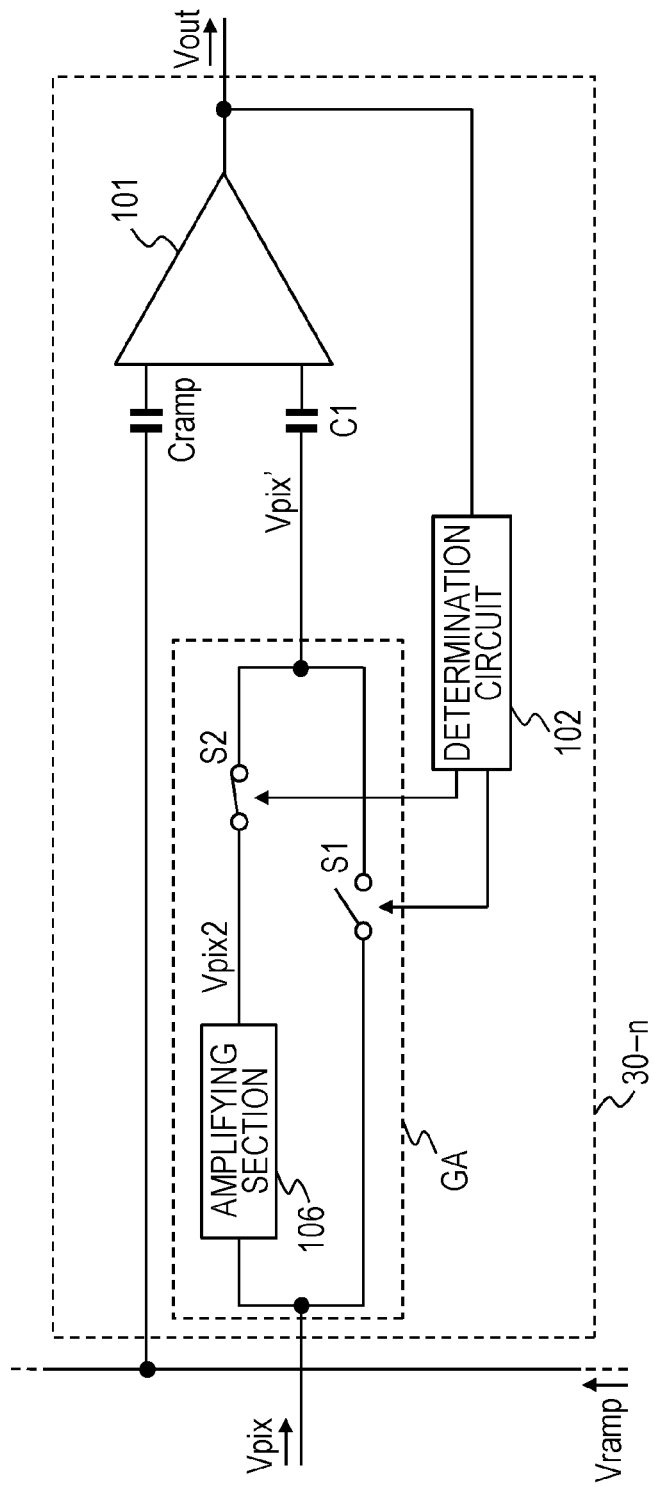
FIG. 16 is a diagram illustrating an example of the configuration of a column comparing unit.

FIG. 16 illustrates the configuration of a column comparing unit 30-n according to an eighth embodiment. A difference between the column comparing unit 30-n illustrated in FIG. 16 and that illustrated in FIG. 2 is that an amplifying section 106 is provided instead of the attenuator 103 in the comparing unit 30 illustrated in FIG. 16. In FIG. 2, the attenuator 103 is connected to the comparator 101 via the switch S1 and the input capacitor C1. In contrast, in FIG. 16, the amplifying section 106 is connected to the comparator 101 via the switch S2 and the input capacitor C1.

Operation according to the eighth embodiment may be similar to that in the first embodiment.

The amplifying section 106 is configured to apply an input analog signal by a gain of greater than 1. Similarly to the attenuator 103, the amplifying section 106 performs application of a gain using only passive elements, and thus the operation speed of a photoelectric conversion device may be increased while preventing power consumption from increasing.

Ninth Embodiment

Figure 17:
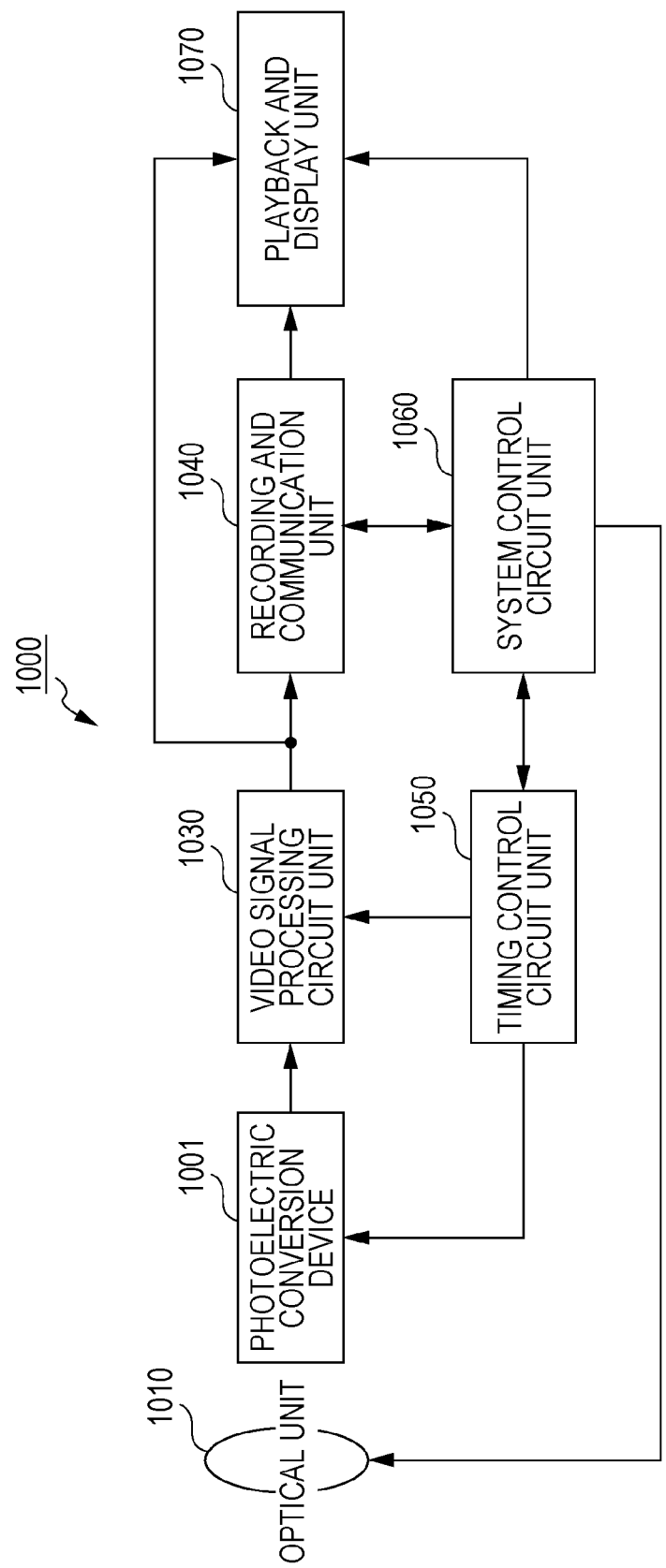
FIG. 17 is a diagram illustrating an example of the configuration of an image capturing system.

An image pickup system according to a ninth embodiment will be described using FIG. 17.

An image pickup system 1000 includes, for example, an optical unit 1010, a photoelectric conversion device 1001, a video signal processing circuit unit 1030, a recording and communication unit 1040, a timing control circuit unit 1050, a system control circuit unit 1060, and a playback and display unit 1070. The image pickup system 1000 may be operated at least in one of an addition mode and a non-addition mode and may set one of the modes.

As the photoelectric conversion device 1001, any of the photoelectric conversion devices 100 described in the above-described embodiments may be used.

The optical unit 1010, which is an optical system such as lenses, forms an image of an object, with light reflected by the object, on a pixel array in which a plurality of pixels are two-dimensionally arranged. The photoelectric conversion device 1001 outputs a signal based on the light, with which the image of the object has been formed in the pixel array, at a time in response to a signal supplied from the timing control circuit unit 1050. The timing generation circuit 13 that the photoelectric conversion device 1001 includes may be omitted and the timing control circuit unit 1050 may be configured to generate a signal that the photoelectric conversion device 1001 needs to operate.

A signal output from the photoelectric conversion device 1001 is input to the video signal processing circuit unit 1030, which is a video signal processing unit. The video signal processing circuit unit 1030 performs processing such as correction of an input electric signal in a method determined by a program or the like. A signal obtained by performing processing in the video signal processing circuit unit 1030 is transmitted to the recording and communication unit 1040 as image data. The recording and communication unit 1040 transmits a signal used to form an image to the playback and display unit 1070 and causes the playback and display unit 1070 to play back or display a moving image or a still image. In addition, the recording and communication unit 1040 performs communication with the system control circuit unit 1060 upon receiving a signal from the video signal processing circuit unit 1030 and furthermore records a signal used to form an image on a recording medium, which is not illustrated.

The system control circuit unit 1060 performs central control on operation of the image pickup system 1000. The system control circuit unit 1060 controls driving of the optical unit 1010, the timing control circuit unit 1050, the recording and communication unit 1040, and the playback and display unit 1070. In addition, the system control circuit unit 1060 includes a storage device, which is not illustrated and an example of which is a recording medium, and a program and the like that are necessary to control operation of the image pickup system 1000 are stored in the storage device. In addition, the system control circuit unit 1060 supplies, in response to a user operation as an example, a signal used to set one of the operation modes within the image pickup system 1000. Specific examples include changing of a line that is to be read or a line that is to be reset, changing of the angle of view due to digital zoom, and shifting of the angle of view due to electronic anti-vibration.

The timing control circuit unit 1050 controls a driving time of the photoelectric conversion device 1001 and that of the video signal processing circuit unit 1030 based on control performed by the system control circuit unit 1060, which is a control unit.

Other Embodiments

The above-described embodiments are examples for the present disclosure. Various changes may be made without departing from the technical ideas of the present disclosure or elements from a plurality of embodiments may be combined. For example, the amplifying portion 20 illustrated in FIG. 1 may be omitted or the input capacitors Cramp and C1 may be omitted in the column comparing unit 30-$n$.

In the above-described embodiments, examples in which one of the first and second gains is 1; however, the one of the first and second gains is not limited to 1 as long as the second gain is smaller than the first gain.

According to the embodiments of the present disclosure, the operation speed of an image pickup device may be increased.

While the present disclosure has been described with reference to embodiments, it is to be understood that the invention is not limited to the disclosed embodiments. The scope of the following claims is to be accorded the broadest interpretation so as to encompass all such modifications and equivalent configurations and functions.

This application claims the benefit of Japanese Patent Application No. 2012-287250 filed Dec. 28, 2012, which is hereby incorporated by reference herein in its entirety.

What is claimed is:

1. A photoelectric conversion device comprising:
a plurality of analog signal output units including a plurality of pixels, each of the plurality of analog signal output units configured to output an analog signal based on a pixel of the plurality of pixels; and
a plurality of signal processing units;
each of the plurality of signal processing units being provided correspondingly to one of the plurality of analog signal output units and including a gain application unit and an AD conversion unit, the gain application unit being configured to apply a gain to an analog signal,
wherein the gain application unit, has an input node and an output node, the input node being connected to the one of the plurality of analog signal output units, the output node being connected to the AD conversion unit, and includes a first path and a second path, one of the first path and the second path outputs an output signal based on the analog signal,
the first path includes a switch configured to comprise a short-circuit between the input node and the output node in ON state, and the first path outputs the analog signal as the output signal in ON state of the switch,
the second path is a path in which the output signal (Vpix1) is generated by attenuating the analog signal, and
the AD conversion unit being configured to convert, from analog to digital, the first amplified signal or the second amplified signal output from the gain application unit.

2. The photoelectric conversion device according to claim 1, wherein one of the signal processing units includes a determination unit, and the second path includes an attenuator configured to attenuate the analog signal, and a second switch arranged between the passive element and the output node,
the determination unit makes the first switch ON state and the second switch OFF state in a case that the analog signal is smaller than a threshold,
the determination unit makes the first switch OFF state and the second switch ON state in a case that the analog signal is larger than a threshold.

3. The photoelectric conversion device according to claim 1, wherein the second path includes an attenuator configured to attenuate the analog signal, the attenuator includes a first capacitor element and a second capacitor element, and
one of nodes of the first capacitor element is connected to the input node and the other node is connected to one of nodes of the second capacitor element and the output node.

4. The photoelectric conversion device according to claim 3, wherein the attenuator includes a switching unit configured to switch between connection and disconnection between the one of the nodes of the second capacitor element and the first capacitor element.

5. The photoelectric conversion device according to claim 3, wherein the AD conversion unit includes a comparator,
the comparator includes first, second, and third input transistors,
the first and second input transistors constitute a differential pair and the third and second input transistors constitute a differential pair,
the attenuator is connected to the first input transistor, and
the corresponding one of the plurality of analog signal output units is connected to the third input transistor.

6. The photoelectric conversion device according to claim 1, wherein the analog signal output unit includes an amplifier connected to a plurality of pixels included in the corresponding one of the plurality of analog signal output units.

7. An image pickup system comprising:
a photoelectric conversion device;
an optical system configured to form an image on the plurality of pixels; and
a video signal processing unit configured to generate image data by performing processing on a signal output from the photoelectric conversion device,
wherein the photoelectric conversion device comprises:
a plurality of analog signal output units including a plurality of pixels, each of the plurality of analog signal output units configured to output an analog signal based on a pixel of the plurality of pixels; and
a plurality of signal processing units;
wherein each of the plurality of signal processing units is provided correspondingly to one of the plurality of analog signal output units and includes a gain application unit and an AD conversion unit, the gain application unit being configured to apply a gain to an analog signal,
wherein the gain application unit has an input node and an output node, the input node being connected to the one of the plurality of analog signal output units, the output node being connected to the AD conversion unit, and includes a first path and a second path, one of the first path and the second path outputs an output signal based on the analog signal,
the first path includes a switch configured to comprise a short-circuit between the input node and the output node in ON state, and the first path outputs the analog signal as the output signal in ON state of the switch,
the second path is a path in which the output signal (Vpix1) is generated by attenuating the analog signal, and
the AD conversion unit being configured to convert, from analog to digital, the output signal output from one of the first path and the second path.

* * * * *